(12) United States Patent
Wajima

(10) Patent No.: US 6,433,466 B2
(45) Date of Patent: Aug. 13, 2002

(54) PIEZOELECTRIC RESONANT COMPONENT

(75) Inventor: Masaya Wajima, Shinminato (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/802,614

(22) Filed: Mar. 9, 2001

(30) Foreign Application Priority Data

May 2, 2000 (JP) ......................................... 2000-133543

(51) Int. Cl.[7] .............................................. H01L 41/08
(52) U.S. Cl. ....................................... 310/344; 310/348
(58) Field of Search ................................ 310/320, 344, 310/348

(56) References Cited

U.S. PATENT DOCUMENTS 3,969,640 A * 7/1976 Staudte ................... 310/344 X
5,323,083 A * 6/1994 Smythe et al. .......... 310/344 X
6,133,673 A * 10/2000 Kawara et al. ............. 310/320
6,163,101 A * 12/2000 Yoshida et al. ............. 310/348
6,215,229 B1 * 4/2001 Kuroda et al. .......... 310/320 X
6,274,968 B1 * 8/2001 Wajima et al. ............. 310/348

* cited by examiner

Primary Examiner—Mark O. Budd
(74) Attorney, Agent, or Firm—Keating & Bennett, LLP

(57) ABSTRACT

A piezoelectric resonant component is constructed such that it is possible to reduce the thickness of an exterior case member while preventing fracture and chipping of the exterior case member. The piezoelectric resonant component preferably includes exterior substrates defining exterior case members and being stacked on an energy trap type piezoelectric resonant element via adhesive layers disposed therebetween so as to define spaces for allowing for free and unhindered vibration of the piezoelectric vibration portion, and a plurality of external electrodes disposed on the surfaces of the exterior substrates on the opposite side of the surfaces thereof fastened to the piezoelectric resonant element are arranged so as not to overlap with the spaces through the intermediary of the exterior substrates.

20 Claims, 11 Drawing Sheets

PIEZOELECTRIC RESONANT COMPONENT

BACKGROUND OF THE INVENTION

1. Field of the Invention

The present invention relates to a piezoelectric resonant component such as a piezo-resonator or a piezoelectric filter. More specifically, the present invention relates to a surface mount piezoelectric resonant component including an energy trap type piezoelectric resonant element.

2. Description of the Related Art

Conventionally, various types of surface mounting type piezoelectric resonant components incorporating an energy trap type piezoelectric resonant element have been proposed.

A conventional example of a piezoelectric resonant component of this type will be described with reference to FIGS. 12A and 12B. A piezoelectric resonant component 101 has a construction in which exterior substrates 103 and 104 are stacked from on top of and below a plate-like piezoelectric resonant element 102.

The piezoelectric resonant element 102 is an energy trap type piezoelectric resonant element. Resonant electrodes 102b and 102c are provided on both main surfaces of a rectangular plate-like piezoelectric substrate 102a. The resonant electrodes 102b and 102c are connected to lead electrodes 102d and 102e. The lead electrodes 102d and 102e are arranged so as to reach the side edges of the piezoelectric substrate 102a.

The portion of the piezoelectric substrate that is opposed to the resonant electrodes 102b and 102c through the piezoelectric substrate 102a constitutes an energy trap type piezoelectric vibration portion.

The exterior substrates 103 and 104 have recesses 103a and 104a, and a space for allowing for free and unhindered vibration of the piezoelectric vibration portion is defined by the recesses 103a and 104a. As shown in FIG. 12B, the exterior substrates 103 and 104 are fixed to the piezoelectric resonant element 102 via adhesive layers 105 and 106.

Further, on the outer surface of the piezoelectric resonant component 101, external electrodes 107 through 109 are arranged so as to be wound around the upper surface, the side surfaces and the lower surface of the piezoelectric resonant component 101. The side surfaces of the external electrodes 107 and 109 are electrically connected to the lead electrodes 102d and 102e. The external electrode 108 is arranged so as to extract capacitance between the external electrodes 107 and 109.

That is, capacitors are defined between the external electrodes 107 and 108 and between the external electrodes 108 and 109.

In the piezoelectric resonant component 101, it is necessary to form spaces B and C for allowing for free and unhindered vibration of the energy trap type piezoelectric vibration portion. Thus, recesses 103a and 104a and are formed in the exterior substrates 103 and 104 as described above.

Incidentally, as in the other electric components, in the piezoelectric resonant component, there is a demand for a reduction in size and thickness. However, in the piezoelectric resonant component 101, it is necessary to provide the spaces B and C, so that when a reduction in thickness is achieved, the mechanical strength of the exterior substrates 103 and 104 deteriorates.

In particular, in the piezoelectric resonant component 101, due to the stress during assembly or mounting on the user side, cracks D and E are generated in the portion where the recesses 103a and 104a of the exterior substrates 103 and 104 are provided, where the mechanical strength is minimum, so that there is a fear of a fracture being generated in the exterior substrates 103 and 104. Thus, to prevent the generation of this fracture, it is necessary to increase the thickness of the exterior substrates 103 and 104 to some degree, which prevents reduction in thickness.

A construction is known in which, to form the spaces B and C, flat exterior substrates are used, and the thickness of the adhesive layer for gluing together the piezoelectric vibration element and the exterior substrates is increased to form the spaces B and C. Also in the case in which a space is formed due to the thickness of this adhesive, the thickness of the exterior substrates is reduced when a reduction in the thickness of the piezoelectric resonant component is achieved. Thus, similarly, to prevent the fracture of the exterior substrates, the thickness of the exterior substrates cannot reduced significantly, thereby making it difficult to achieve a reduction in thickness.

SUMMARY OF THE INVENTION

In order to overcome the problems described above, preferred embodiments of the present invention provide a piezoelectric resonant component in which it is possible to achieve a reduction in the thickness of the exterior case material and in which even when a thin exterior case material is used, fracture or chipping is prevented.

According to a preferred embodiment of the present invention, a piezoelectric resonant component includes an energy trap type piezoelectric resonant element which has a piezoelectric plate and a plurality of resonant electrodes partially disposed on both main surfaces of the piezoelectric plate and in which a piezoelectric vibration portion is defined by a portion in which the resonant electrodes of the main surfaces are opposed to each other, an exterior case member which is fixed to at least one surface of the piezoelectric resonant element so as to define a space for allowing for free and unhindered vibration of the vibration portion of the piezoelectric resonant element, and a plurality of external electrodes arranged on the surface on the opposite side of the surface of the exterior case member which is fixed to the piezoelectric resonant element, wherein the plurality of external electrodes are arranged such that the plurality of external electrodes do not overlap with the space through the intermediary of the exterior case member.

In another preferred embodiment of the present invention, a piezoelectric resonant component includes an energy trap type piezoelectric resonant element which has a piezoelectric plate and a plurality of resonant electrodes partially arranged on both main surfaces of the piezoelectric plate and in which a piezoelectric vibration portion is defined by a portion of the piezoelectric plate in which the resonant electrodes on the main surfaces are opposed to each other, an exterior case member which is fixed to at least one surface of the piezoelectric resonant element so as to define a space for allowing for free and unhindered vibration of the vibration portion of the piezoelectric resonant element, and a plurality of external electrodes arranged on the surface on the opposite side of the surface of the exterior case member which is fixed to the piezoelectric resonant element, wherein a recess is formed in the surface on the opposite side of the surface of the exterior case member which is fixed to the piezoelectric resonant element so as to be opposed to the space.

In another preferred embodiment of the present invention, the portion of the exterior case member that is opposed to the space is preferably curved toward the piezoelectric resonant element side.

In another modified preferred embodiment of the piezoelectric resonant component of the present invention, a recess is formed in the piezoelectric resonant element side surface of the exterior case member, and a space is defined by this recess.

In still another preferred embodiment of the piezoelectric resonant component of the present invention, the surface of the exterior case member which is fastened to the piezoelectric resonant element is a flat surface, and the adhesive layer joining the piezoelectric resonant element with the exterior case member is constructed so as to form the space.

It is also preferable that the exterior case member is a flat-plate-like exterior substrate, and the pair of exterior substrates are stacked on both sides of the piezoelectric resonant element.

In another modified preferred embodiment of the piezoelectric resonant component of the present invention, the exterior case member has a flat-plate-like exterior substrate and a cavity forming exterior case member having an opening on the exterior substrate side and joined to the exterior substrate from the opening side, wherein the piezoelectric resonant element is fixed to the exterior substrate or the cavity forming exterior case member and sealed in a cavity formed by the exterior substrate and the cavity forming exterior case member.

Other features, elements, characteristics, and advantages of the present invention will become apparent from the detailed description of preferred embodiments of the present invention below with reference to the attached drawings.

DETAILED DESCRIPTION OF PREFERRED EMBODIMENTS

The present invention will become apparent from the following description of specific preferred embodiments of the present invention made with reference to the drawings.

Figure 1A:
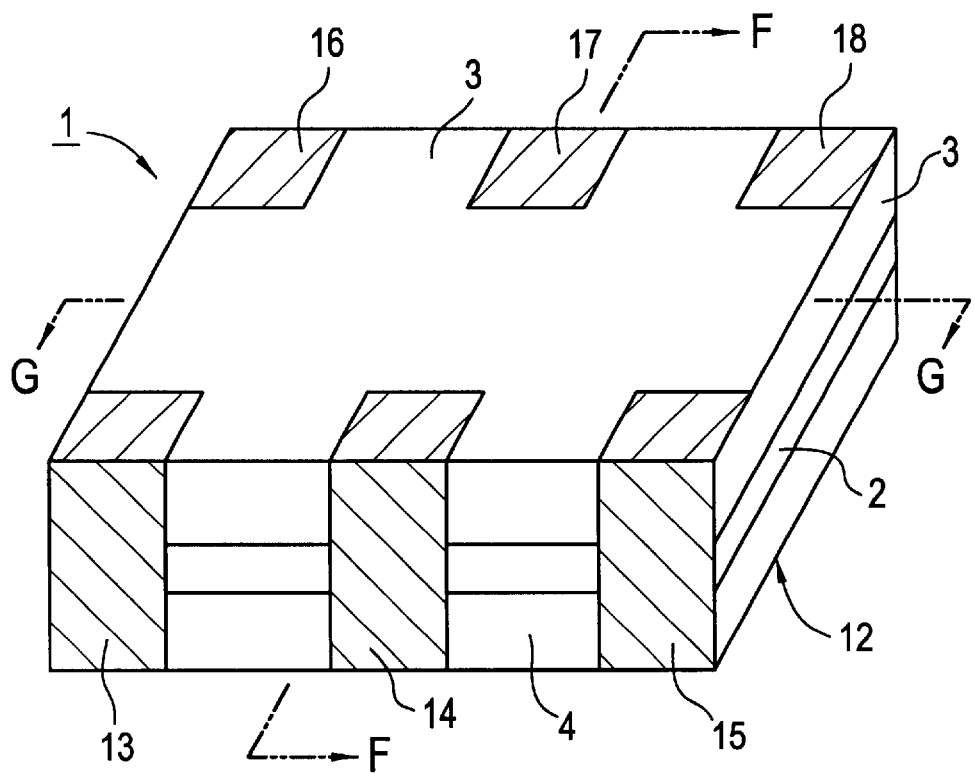
FIG. 1A is a perspective view of a piezoelectric resonant component according to a first preferred embodiment of the present invention.
Figure 1B:
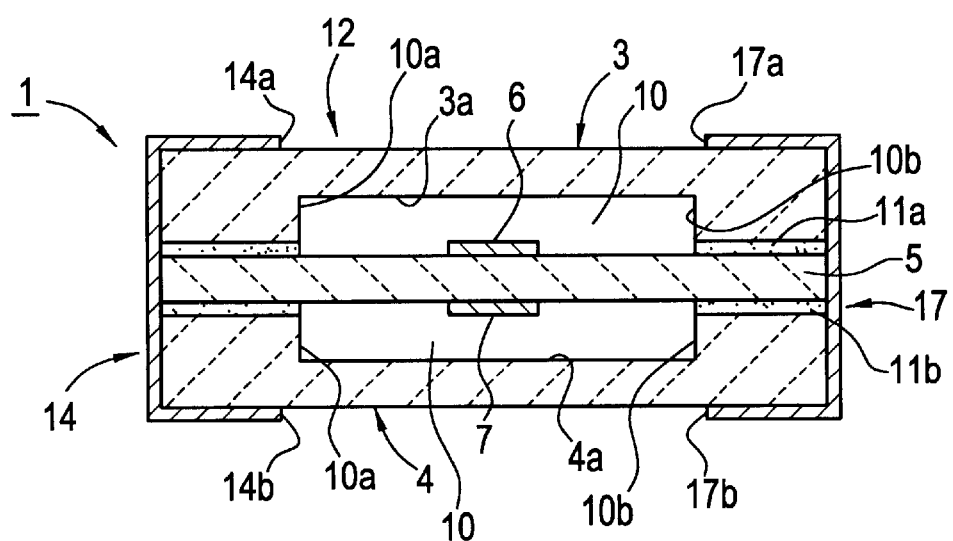
FIG. 1B is a sectional view taken along the line A—A of FIG. 1A.
Figure 2:
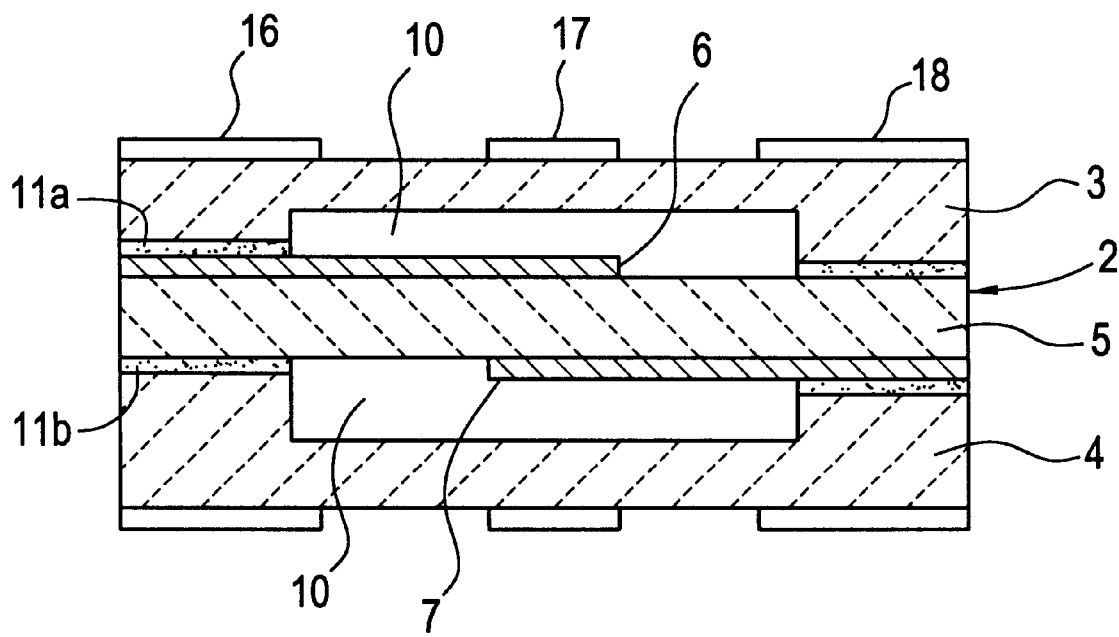
FIG. 2 is a sectional view of the piezoelectric resonant component of the first preferred embodiment taken along the line G—G of FIG. 1A.

FIG. 1A is a perspective view showing a piezoelectric resonant component according to the first preferred embodiment of the present invention, FIG. 1B is a sectional view taken along the line F—F of FIG. 1A, and FIG. 2 is a sectional view taken along the line G—G of FIG. 1A.

In a chip type piezoelectric resonant component 1, exterior substrates 3 and 4 preferably defined by substantially rectangular plates having a substantially rectangular planar configuration of approximately the same size are stacked from on top of and below a piezoelectric resonant element 2 having a substantially rectangular plate shape.

Figure 3:
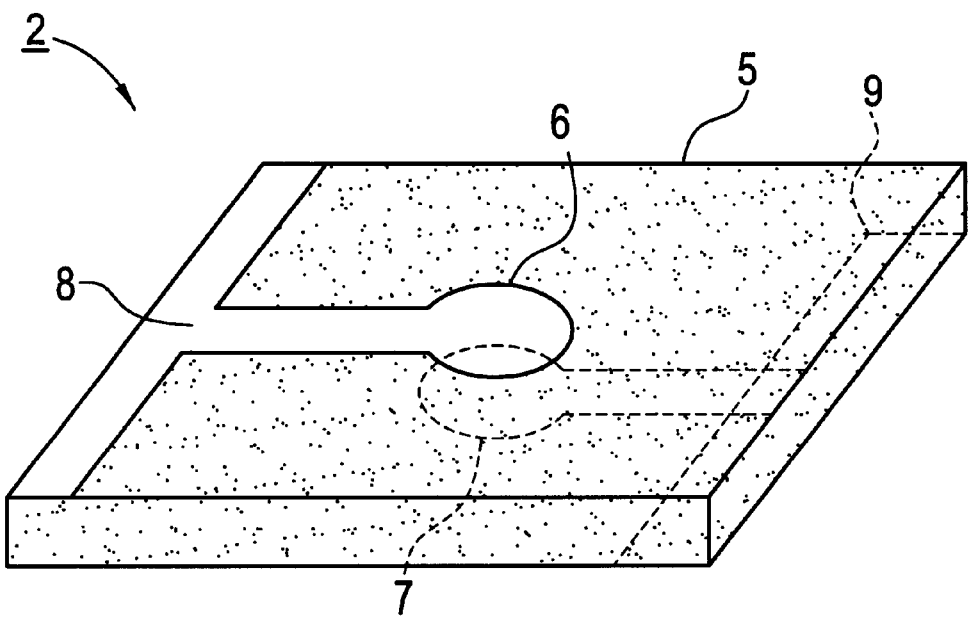
FIG. 3 is a perspective view showing the piezoelectric resonant element used in the first preferred embodiment of the present invention.

The piezoelectric resonant element 2 is preferably an energy trap type piezoelectric resonant element utilizing thickness longitudinal vibration mode. As shown in FIG. 3, the piezoelectric resonant element 2 has a piezoelectric substrate 5 having a substantially rectangular plate-shape configuration. The piezoelectric substrate 5 is preferably formed of a piezoelectric ceramic that has undergone polarization processing in the thickness direction. However, the piezoelectric substrate 5 may be formed by a piezoelectric single crystal such as quartz. A first resonant electrode 6t is provided at the approximate center of the upper surface of the piezoelectric substrate 5. A second resonant electrode 7 is disposed underneath the piezoelectric substrate 5 so that the top and bottom surfaces are opposed to each other through the first resonant electrode 6 and the piezoelectric substrate 5.

The portion of the device in which the resonant electrodes 6 and 7 are opposed to each other through the piezoelectric substrate 5 constitutes the piezoelectric vibration portion.

A lead electrode 8 is disposed next to the resonant electrode 6, and a lead electrode 9 is disposed next to the resonant electrode 7. The lead electrodes 8 and 9 are arranged so as to reach both side edges in the vicinity of the end surface of the piezoelectric substrate 5.

Referring again to FIG. 1, a recess 3a is formed in the lower surface of the exterior substrate 3. Similarly, a recess 4a is formed in the upper surface of the exterior substrate 4. The recesses 3a and 4a are provided for the purpose of forming spaces 10 that allow for free and unhindered vibration of the piezoelectric vibration portion.

Thus, the thickness of the portions of the exterior substrates 3 and 4 in which the recesses 3a and 4a are formed is relatively small. In the following, the portions of the exterior substrates 3 and 4 in which the recesses 3a and 4a are formed are referred to as space formation portions.

The recesses 3a and 4a are preferably substantially rectangular in plan view. However, the recesses 3a and 4a may also have other configurations such as a substantially circular one in plan view.

The exterior substrates 3 and 4 are preferably made of an insulating ceramic such as alumina. The exterior substrates 3 and 4 are stacked on the piezoelectric resonant element 2 and integrated therewith via adhesive layers 11a and 11b.

As described above, the resulting laminated structure 12 includes the piezoelectric resonant element 2, and the exterior substrates 3 and 4. External electrodes 13 through 15 and external electrodes 16 through 18 are provided on the side surfaces of the laminated structure 12. The external electrodes 13 through 18 are arranged so as to not only extend on the side surfaces of the laminated structure 12 but also to reach the upper and lower surfaces thereof.

The external electrodes 13 through 18 are preferably formed by the application and baking of a conductive paste. However, it is also possible for the external electrodes 13 through 18 to be formed by a thin film forming method such as evaporation, plating or sputtering, or by other suitable processes. Further, it is also possible for the external electrodes 13 through 18 to include a plurality of electrode layers that have been stacked and joined together.

In the present preferred embodiment, the external electrodes 13 and 16 are electrically connected to the lead electrode 8 of the piezoelectric resonant element 2, and the external electrodes 15 and 18 are electrically connected to the lead electrode 9. Further, the external electrodes 14 and 17 are provided for the purpose of defining capacitors between the external electrodes 13 and 16 and between the external electrodes 15 and 18.

One of the advantages of the present preferred embodiment is that the external electrodes 13 through 18 are arranged so as not to overlap with the spaces 10 through the exterior substrates 3 and 4. For example, as shown in FIG. 1B, the inner end edges 14a, 14b, 17a and 17b of the portions of the external electrodes 14 and 17 reaching the upper and lower surfaces of the laminated structure 12 are positioned on the outer side of the end edges 10a and 10b in the width direction of the spaces 10 of the laminated structure 12 with respect to the width direction. Thus, the external electrodes 14 and 17 do not overlap with the spaces 10 through the exterior substrates 3 and 4. Similarly, the external electrodes 13, 15, 16 and 18 are arranged so as not to overlap with the spaces in the width direction of the laminated structure 12 through the intermediary of the external substrate 3 or the external substrate 4.

Further, the external electrodes 13, 15, 16 and 18 do not overlap with the spaces 10 through the intermediary of the exterior substrates 3 and 4 also in the length direction of the laminated structure 12 (See FIG. 2).

In manufacturing the piezoelectric resonant component 1, the portions of the external electrodes 13 through 18 disposed on the upper surface of the piezoelectric substrate 3 and the portion thereof provided on the lower surface of the piezoelectric substrate 4 are preferably formed beforehand. After this, the piezoelectric substrates 3 and 4 are stacked and on the piezoelectric resonant element 2 and integrated therewith through the intermediary of the adhesive layers 11a and 11b. In the laminated structure 12 obtained in this way, the portions of the external electrodes 13 through 18 disposed on the side surfaces of the laminated structure 12 are finally formed.

Thus, when stacking the exterior substrates 3 and 4 on the piezoelectric resonant element 2 and gluing them thereto, the laminated structure 12 is pressurized in the thickness direction.

Figure 12A:
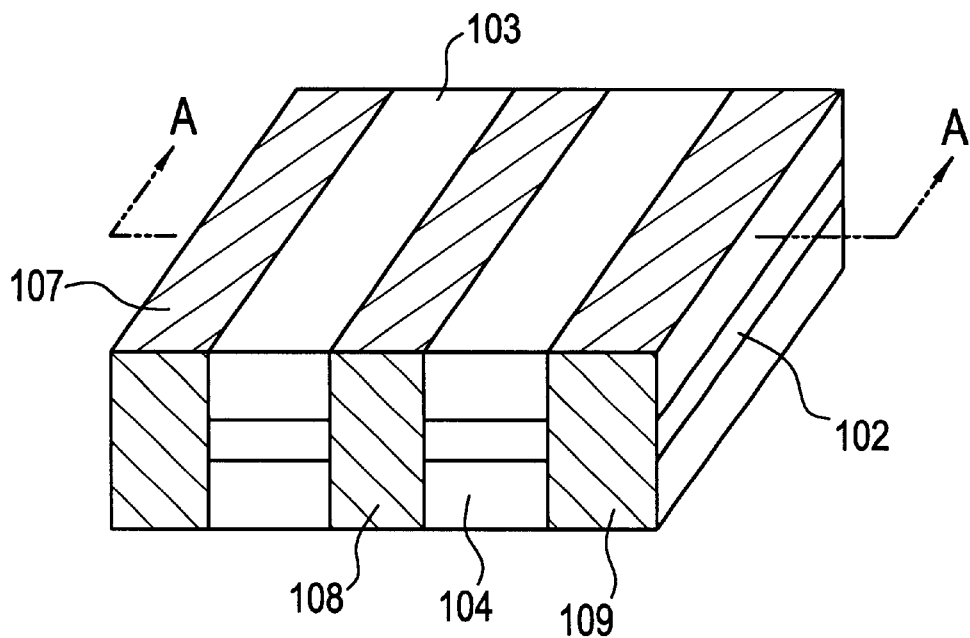
FIG. 12A is a perspective view showing an example of a conventional piezoelectric resonant component.
Figure 12B:
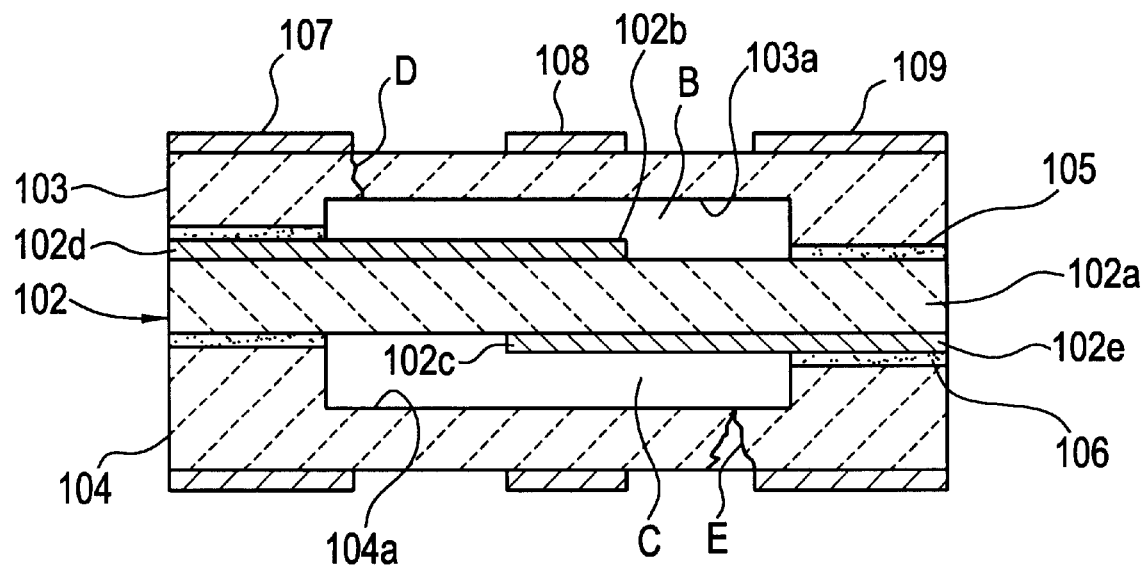
FIG. 12B is a sectional view taken along the line A—A of FIG. 12A.

In the conventional piezoelectric resonant component 101, in the above-mentioned pressurizing process, a step is generated between the portions of the external electrodes 107 through 109 positioned on the upper and lower surfaces of the laminated structure and the other portions of the exterior substrates, so that the pressurizing force is large in the portions where the external electrodes 107 through 109 are formed. On the other hand, the external electrodes 107 through 109 are preferably arranged so as to reach the positions where they overlap with the spaces B and C. Thus, in the space formation portions of the exterior substrates 102 and 103, cracks D and E are liable to be generated. That is, as shown in FIG. 12B, cracks D and E are liable to be generated.

In contrast, in the piezoelectric resonant component 1 according to the first preferred embodiment of the present invention, the portions of the external electrodes 13 through 18 reaching the upper surface of the exterior substrate 3 and the lower surface of the exterior substrate 4 are arranged so as not to overlap with the spaces 10 in the thickness direction. Thus, the pressurizing force is not sufficiently applied to the portions where the spaces 10 are formed, so that even when the thickness of the exterior substrates 3 and 4 is small and the wall thickness of the space formation portions is small, it is possible to reliably prevent fracture of the exterior substrates 3 and 4.

In addition, due to the reduction in the thickness of the exterior substrates 3 and 4, also regarding the warpage of the exterior substrates 3 and 4 due to the contraction when baking the conductive paste at the time of the formation of the external electrodes 13 through 18, the external electrodes are formed only in the portions where the wall thickness is large, so that it is possible to prevent warpage of the exterior substrates 3 and 4.

Further, the stress applied when mounting the finally obtained piezoelectric resonant component 1 on a printed circuit board or other substrate is also concentrated on the sealing portion around the spaces 10, so that fracture of the exterior substrates 3 and 4 due to the stress at the time of mounting is liable to be generated.

While there is no particular restriction regarding the thickness of the external electrodes 13 through 18, it is desirable for the thickness to be approximately 5 $\mu$m to about 50 $\mu$m when forming them through application and baking of a conductive paste. When no lapping is performed, surface irregularities of about 2 $\mu$m to about 5 $\mu$m exist on the surfaces of the exterior substrates 3 and 4. Thus, to absorb such surface irregularities, it is desirable that the thickness of the external electrodes 13 through 18 is not less than about 5 $\mu$m. Further, when the thickness of the external electrodes 13 through 18 is too large, the cost of the external electrodes 13 through 18 increases, and warpage is liable to be generated in the exterior substrates 3 and 4 when performing baking.

Further, when the thickness of the external electrodes 13 through 18 exceeds about 50 $\mu$m, trouble such as midadsorption is liable to be generated when finally mounting the piezoelectric resonant component 1 on the printed circuit board.

In the piezoelectric component 1 of the first preferred embodiment of the present invention, the external electrodes 13 through 18 are preferably arranged so as not to overlap with the spaces 10 on the upper surface of the exterior substrate 3 and the lower surface of the exterior substrate 4. However, if the external electrodes are arranged so as not to overlap with the spaces in the thickness direction only either on the upper surface of the exterior substrate 3 or on the lower surface of the exterior substrate 4, it is possible to reduce the pressurizing force applied to the space formation portion at the time of assembly and at the time of mounting in accordance with various preferred embodiments of the present invention. Thus, while it is desirable that the external electrodes 13 through 18 be arranged so as not to overlap with the spaces both on the upper surface of the exterior substrate 3 and the lower surface of the exterior substrate 4, it is possible in some cases for the external electrodes 13 through 18 to be arranged so as not to overlap with the spaces 10 only either on the upper surface of the exterior substrate 3 or the lower surface of the exterior substrate 4.

Figure 4A:
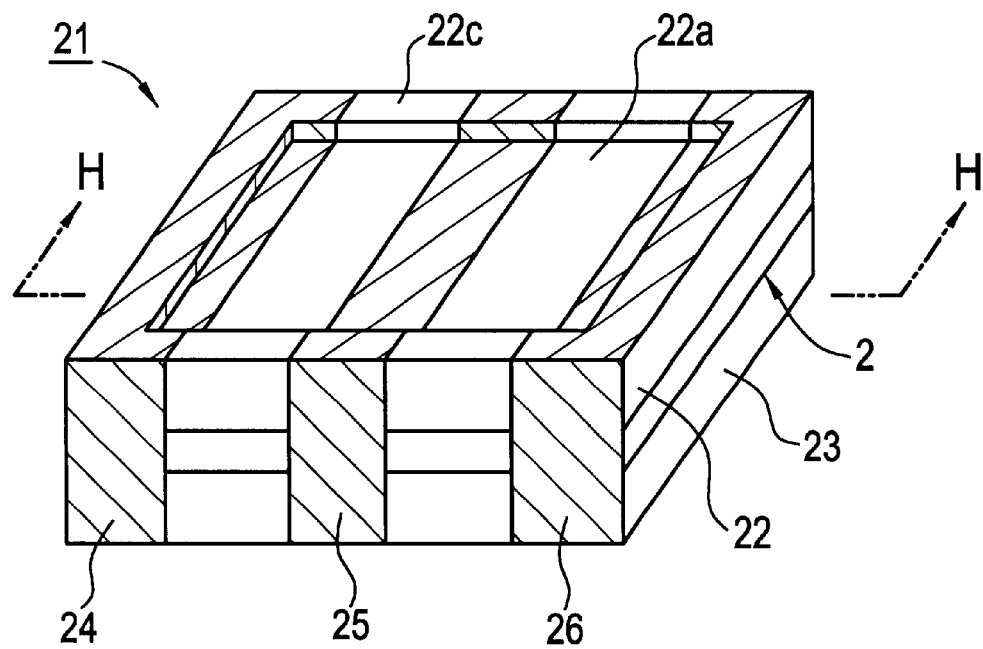
FIG. 4A is a perspective view of a piezoelectric resonant component according to a second preferred embodiment of the present invention.
Figure 4B:
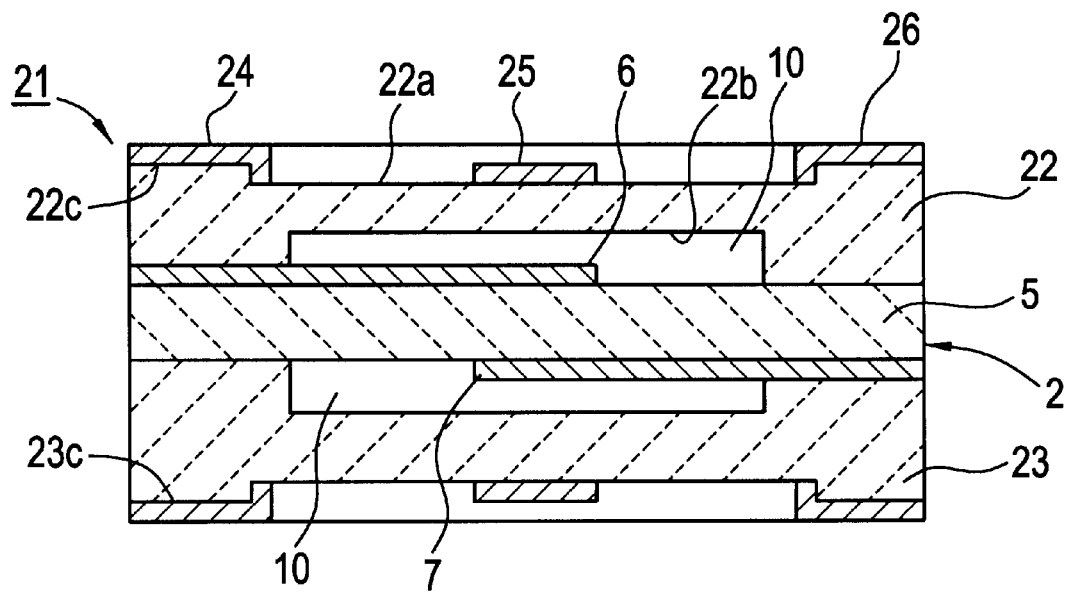
FIG. 4B is a longitudinal sectional view of the piezoelectric resonant component of FIG. 4A.

FIG. 4A is a perspective view of a piezoelectric resonant component according to a second preferred embodiment of the present invention, and FIG. 4B is a sectional view taken along the line H-H of FIG. 4B.

In the chip type piezoelectric resonant component 21 of the second preferred embodiment of the present invention, a piezoelectric resonant element 2, which is preferably the same as the chip type piezoelectric resonant component 1, is used. Here, an exterior substrate 22 and an exterior substrate 23 are respectively stacked on the upper and lower surfaces of the piezoelectric resonant component 2 through the intermediary of adhesive layers (not shown) and integrated therewith.

A recess 22a is formed in the upper surface of the exterior substrate 22, and a recess 23a is formed in the lower surface of the exterior substrate 23. That is, while the exterior substrates 22 and 23 have recesses 22b and 23b for forming spaces 10 in the surfaces of the piezoelectric resonant element 2, the recesses 22a and 23a are also preferably formed in the outer surfaces when the substrates are stacked together.

In plan view, the size of the recesses 22a and 23a is such that they include the spaces 10.

In the piezoelectric resonant component 21, external electrodes 24 through 26 are arranged so as to be wound around the upper surface, a pair of side surfaces and the lower surface of the laminated structure including the piezoelectric resonant element 2 and the exterior substrates 22 and 23. Further, while the external electrodes 24 through 26 extend to the interior of the recess 22a on the surface of the laminated structure, they are also preferably provided on the frame-like portion 22c around the recess 22a. Similarly, also on the lower surface of the laminated structure, the external electrodes 24 through 26 are arranged to reach not only the interior of the recess 23a but also the frame-like portion 23c around the recess 23a.

Thus, at the time of assembly, a large pressurizing force is applied to the frame-like portions 22c and 23c, and no large pressurizing force is applied to the remaining portion. Thus, as in the first preferred embodiment, it is possible to prevent fracture of the exterior substrates 22 and 23 in the space formation portions. Further, the stress when finally mounting the chip type piezoelectric resonant component 21 on the printed circuit board is also concentrated at the portion where the frame-like portions 22c and 23c are formed, so that fracture of the exterior substrates 22 and 23 is prevented at the time of assembly.

Further, in an electronic component such as a chip type piezoelectric resonant component, external electrodes are often finally completed by electrolytic barrel plating. However, with the reduction in the thickness of electronic parts, there is a tendency for adhesion to each other of the electrodes of the electronic components to frequently happen. However, when, as in the case of the present preferred embodiment, the recesses 22a and 23a and the frame-like portions 22c and 23c are formed in the outer surfaces of the piezoelectric resonant component 21, the adhesion caused by the surface tension due to the plating liquid is not easily generated. Thus, it is possible to prevent the above-mentioned sticking to each other of the piezoelectric resonant components.

In the second preferred embodiment of the present invention, it is possible for only one of the recesses 22a and 23a to be formed. In that case also, while the effect of preventing fracture of the exterior substrates 22 and 23 deteriorates as compared with the second preferred embodiment, it is possible to prevent fracture of the exterior substrates 22 and 23 in accordance with the present invention.

Figure 5:
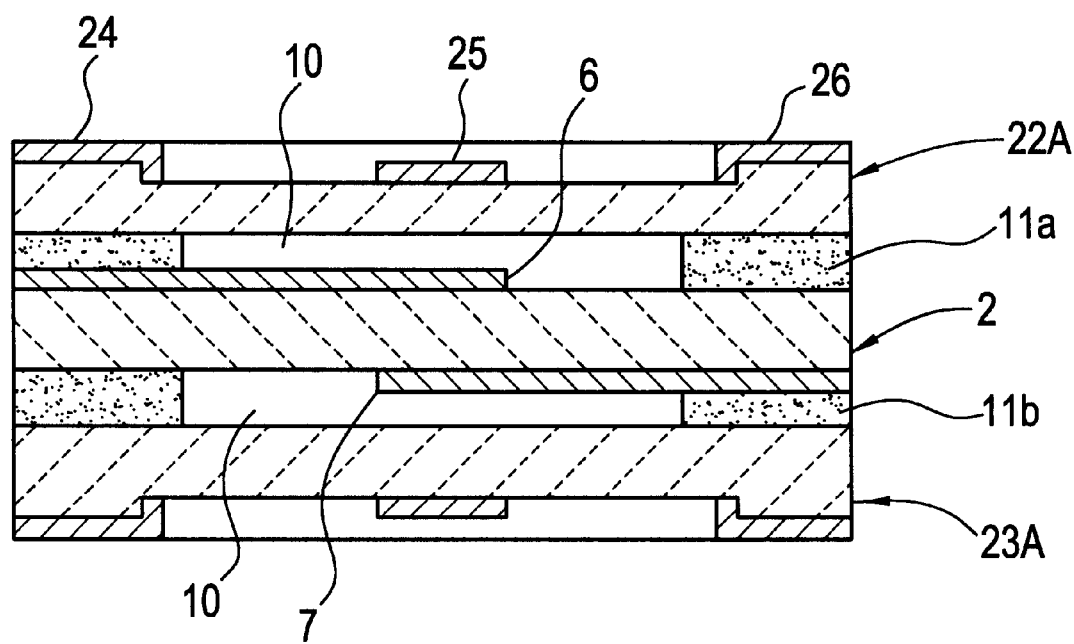
FIG. 5 is a longitudinal sectional view illustrating a modification of the piezoelectric resonant component of the second preferred embodiment of the present invention.

Further, while in the second preferred embodiment, the recesses 22b and 23b are preferably formed on the inner side of the exterior substrates 22 and 23 to define the spaces 10, it is also possible, as shown in FIG. 5, to use exterior substrates with flat inner sides as exterior substrates 22A and 23A. In this case, the adhesive layers 11a and 11b joining the piezoelectric resonant element 2 to the external substrates 22A and 23A are made thick to thereby define the spaces 10. In the above-described first preferred embodiment also, it is possible to use flat-plate-like exterior substrates 3 and 4 with flat inner sides and to make the adhesive layers 11a and 11b thick to thereby define the spaces 10.

Figure 6A:
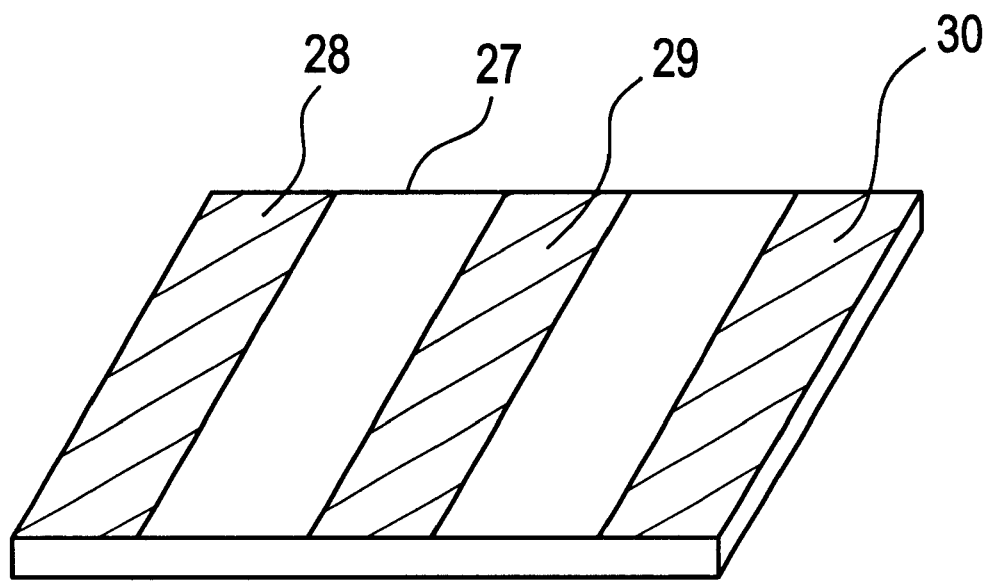
FIGS. 6A and 6B are perspective views for illustrating processes for forming the exterior substrate in the second preferred embodiment of the present invention.
Figure 6B:
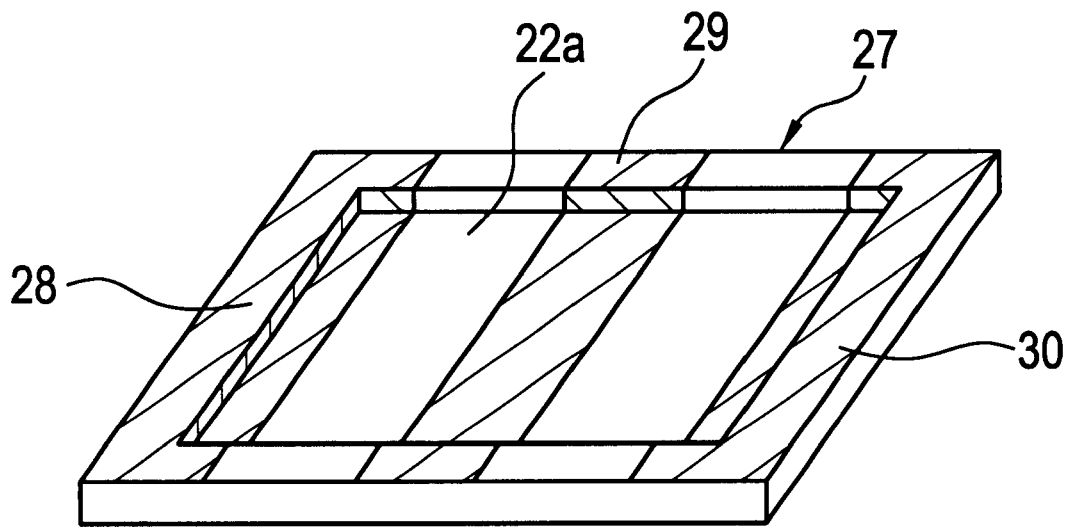

In the second preferred embodiment of the present invention, when producing the exterior substrate 22, a substantially rectangular plate-like ceramic green sheet molding for obtaining the exterior substrate 22 is preferably obtained. Next, as shown in FIG. 6A, conductive pastes 28 through 30 for forming the external electrodes are applied to the upper surface of the ceramic green sheet molding 27. After this, as shown in FIG. 6B, the recess 22a is formed by stamping. While it is not clear in FIG. 6B, in this process, a recess for forming the space 10 is also formed on the lower surface side. After this, after forming the recesses, the ceramic green sheet molding is baked and, at the same time, the conductive pastes 28 through 30 are baked. In this way, after applying the conductive pastes 28 through 30, the recess 22a is shaped, and, after this, the ceramic green sheet molding 27 and the external electrodes are simultaneously baked, whereby it is possible to enhance the formation accuracy of the external electrodes 24 through 26 reaching the recess 22a.

Regarding the depth of the recess 22a, there is no particular restriction. However, it is desirable that the depth be not more than about 50 $\mu$m. When the depth of the recess 22a exceeds approximately 50 $\mu$m, there is a fear of trouble such as mis-adsorption being generated when finally mounting the piezoelectric resonant component 21.

In addition, in achieving a reduction in the thickness of the piezoelectric resonant component 21, it is more desirable that the depth of the recess 22a be small.

Figure 7A:
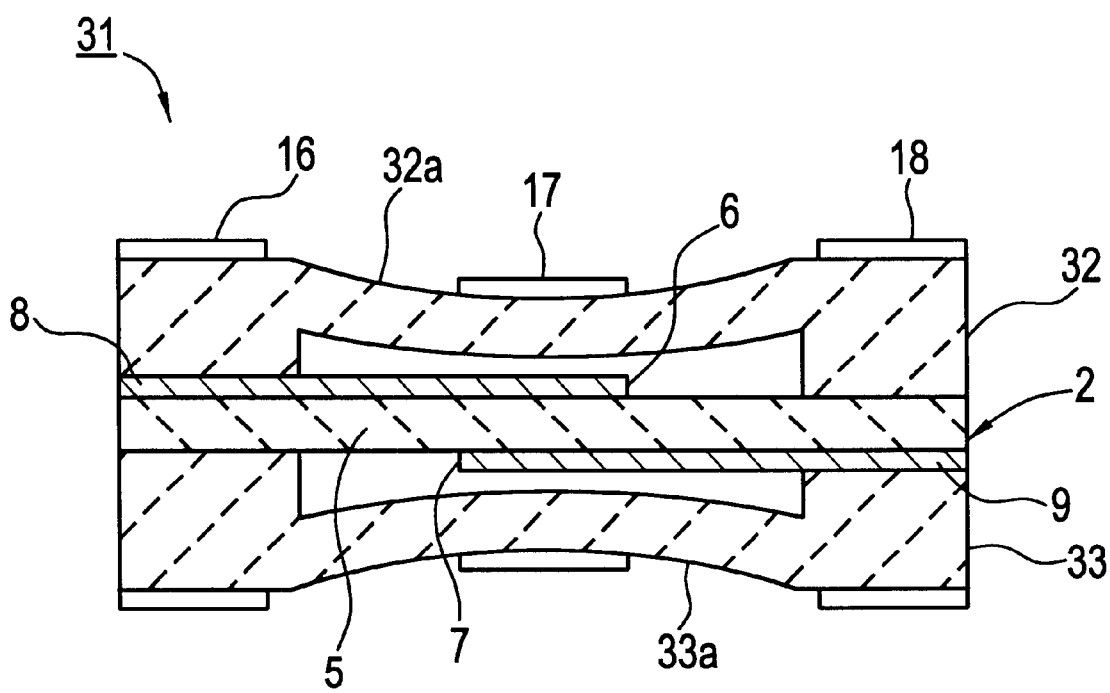
FIG. 7A is a longitudinal sectional view of a piezoelectric resonant component according to a third preferred embodiment of the present invention.
Figure 7B:
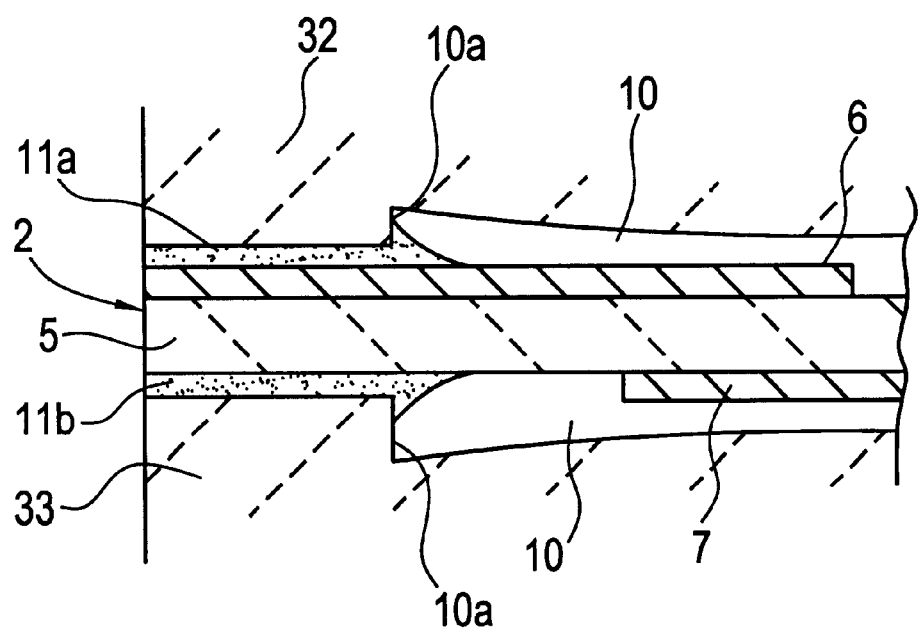
FIG. 7B is a partially cutaway sectional view showing in an enlarged state a main portion of the piezoelectric resonant component of FIG. 7A.

FIG. 7A is a sectional view of a piezoelectric resonant component according to a third preferred embodiment of the present invention, and FIG. 7B is a partially cutaway sectional view showing a main portion thereof in an enlarged state. In the chip-type piezoelectric resonant component 31 of the third preferred embodiment, the piezoelectric resonant element 2 similar to that of the first and second preferred embodiments is used. The present preferred embodiment differs from the first preferred embodiment in that the exterior substrates 32 and 33 are curved toward the piezoelectric resonant element 2 in the space formation portion. That is, in the space formation portion, the exterior substrates 32 and 33 are curved so as to protrude toward the piezoelectric resonant element 2. In the sealing portion around the space formation portion, the upper and lower surfaces of the exterior substrates 32 and 33 are flat surfaces.

Thus, in the curved portions 32a and 33a, the outer surfaces of the exterior substrates 32 and 33 are preferably concave. Thus, in assembly, with respect to the piezoelectric resonant element 2, the pressurizing force when the exterior substrates 32 and 33 are glued together and pressurized in the thickness direction is not applied to the curved portions 32a and 33a but concentrated to the sealing portion around them. Thus, it is possible to reliably prevent fracture of the exterior substrates 32 and 33 in the thin curved portions 32a and 33a where the spaces 10 are formed. Further, the stress when mounting the piezoelectric resonant component 31 on the printed circuit board is also concentrated on the sealing portion side as described above, so that it is possible to reliably prevent fracture of the exterior substrates 32 and 33 in the curved portions 32a and 33a.

Thus, as in the piezoelectric resonant components 1 and 21 of the first and second preferred embodiments, in the piezoelectric resonant component 31 also, it is possible to achieve a reduction in the thickness of the exterior substrates 32 and 33, and achieve a reduction in the thickness of the piezoelectric resonant component 31.

Further, in the curved portions 32a and 33a, the inner surfaces of the exterior substrates 32 and 33 are also preferably curved. Thus, as shown in FIG. 7B, when the exterior substrates 32 and 33 are glued to the piezoelectric resonant element 2 via the adhesive layers 11a and 11b, excess adhesive gathers in the vicinity of the end edges 10a and 10b of the spaces 10 because the thickness of the spaces 10 is large on the side nearer to the sealing portion, and the adhesive does not easily ooze to the piezoelectric vibration portion side. Thus, it is also possible to prevent deterioration in characteristics of the device, which deterioration is attributable to the oozing of the adhesive to the piezoelectric vibration portion side.

As in the first preferred embodiment, in the third preferred embodiment, external electrodes 13 through 18 (See FIG. 1) extend from the side surface to the upper surface and the lower surface of the laminated structure. However, as in the second preferred embodiment, it is also possible to arrange the external electrodes 13 through 18 so as to be wound around the pair of side surfaces, the upper surface and the lower surface of the laminated structure including the piezoelectric resonant element 2, and the exterior substrates 32 and 33.

Similarly, in the above-described second preferred embodiment also, it is possible to form, instead of the external electrodes 24 through 26, external electrodes similar to the external electrodes 13 through 18 of the first preferred embodiment.

Figure 8:
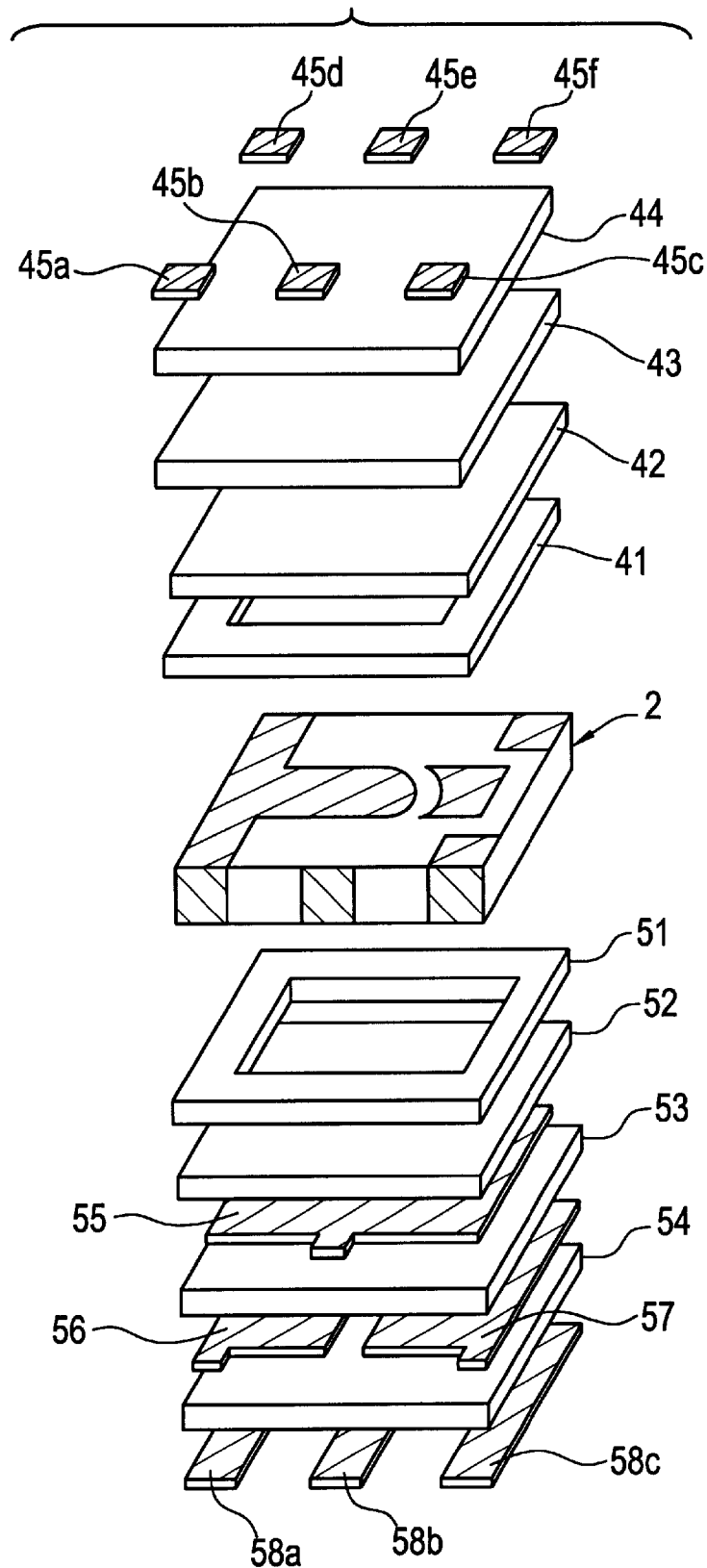
FIG. 8 is an exploded perspective view showing a specific example of a piezoelectric resonant component to which various preferred embodiments of the present invention is applicable.

While in the first through third preferred embodiments, the exterior substrates are preferably stacked on the main surfaces of the piezoelectric resonant element, the piezoelectric resonant component of the present invention is not restricted to this structure. FIG. 8 is an exploded perspective view showing another example of a piezoelectric resonant component to which preferred embodiments of the present invention is applicable. In the construction shown in FIG. 8, a substantially rectangular frame-like spacer sheet 41 and exterior substrate sheets 42 through 44 are disposed above the piezoelectric resonant element 2 so as to define the space 10. The spacer sheet 41 and the exterior substrate sheets 42 through 44 may be formed of the same ceramic material, or different ceramic materials. After the spacer sheet 41 and the exterior substrate sheets 42 through 44 are stacked together and integrated, baking is performed, whereby there is formed an exterior substrate as the above-described exterior case member.

On the upper surface of the external substrate sheet 44, external electrodes 45a through 45f are preferably formed beforehand as in the first preferred embodiment.

Further, also below the piezoelectric resonant element 2, the spacer sheet 51, and the exterior substrate sheets 52 through 54 are stacked. However, the exterior substrate sheets 53 and 54 are preferably formed of a dielectric ceramic green sheet to constitute the capacitor. Also, between the exterior substrate sheets 52 and 53, a common electrode 55 for defining the capacitor is provided. Further, between the exterior substrate sheets 53 and 54, capacitance electrodes 56 and 57 are provided to constitute the capacitor. Further, a conductive paste is applied to the lower surface of the exterior substrate sheet 54, and external electrodes 58a through 58c are preferably formed beforehand. In the portion below the piezoelectric resonant element 2, the spacer sheet 51 and the exterior substrate sheets 52 through 54 are stacked together and integrated to constitute the exterior substrate.

After stacking and integrating the structure shown in FIG. 8, external electrodes are formed on the side surface of the laminated structure as in the first preferred embodiment, whereby it is possible to easily obtain a capacitance built-in type piezoelectric resonator.

While in the first through third preferred embodiments shown above, plate-like exterior substrates are stacked on top of and below the piezoelectric resonant element, the present invention is not restricted to this structure.

Figure 9A:
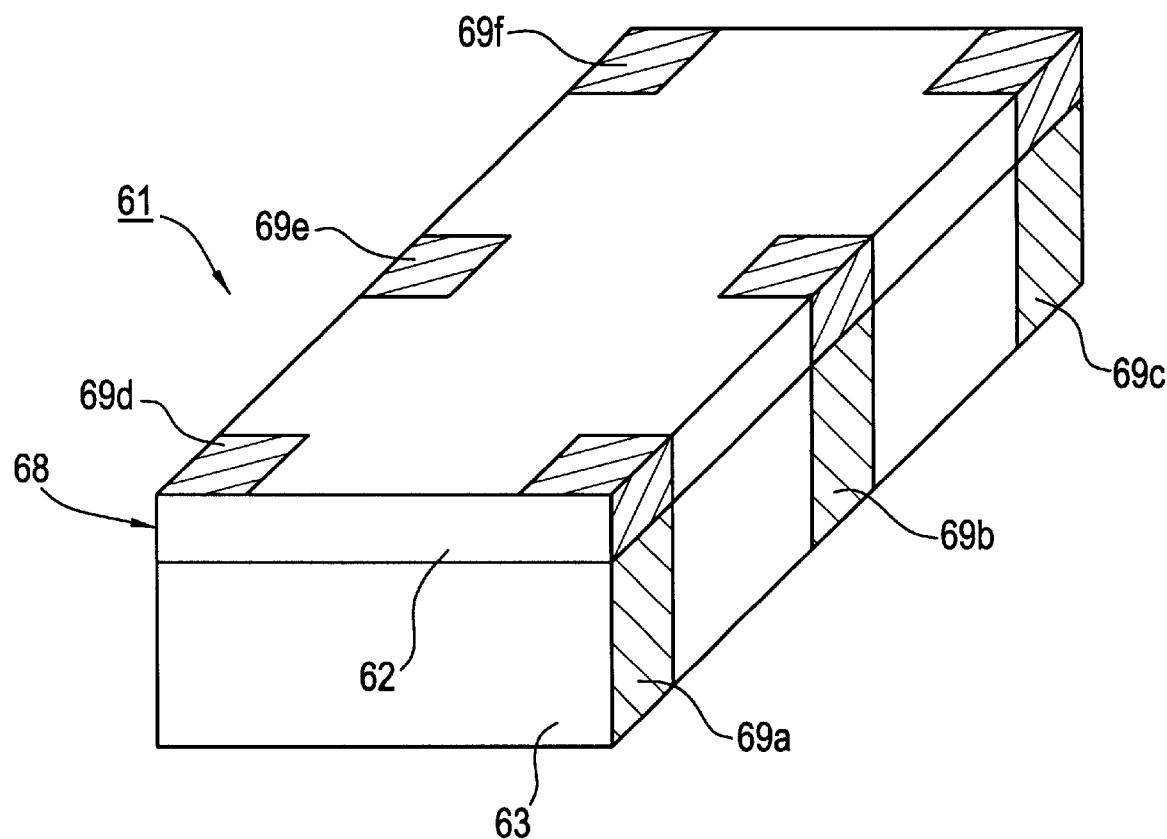
FIGS. 9A and 9B are a perspective view and a lateral sectional view of a chip type piezoelectric resonant component according to a fourth preferred embodiment of the present invention.
Figure 9B:
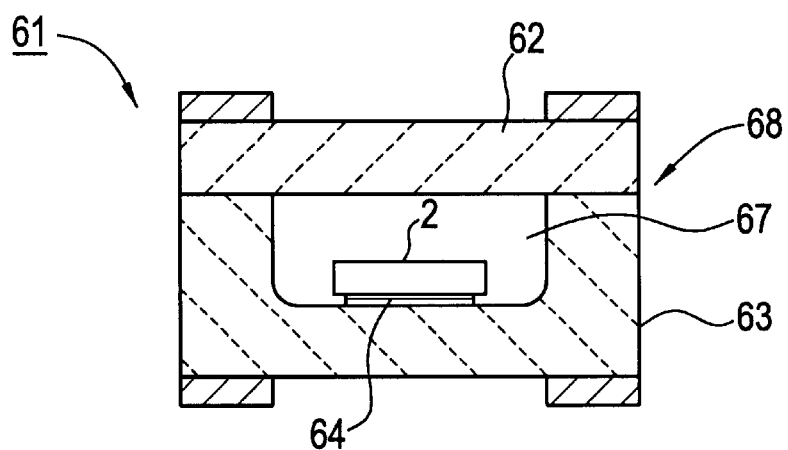

For example, in the chip type piezoelectric resonant component 61 according to the fourth preferred embodiment shown in FIGS. 9A and 9B, the piezoelectric resonant element 2 is fixed to the upper surface of a cavity formation exterior case member 63 having an upwardly open opening through the intermediary of an adhesive 64. Due to the thickness of the adhesive 64, a space 65 for allowing for free and unhindered vibration of the piezoelectric vibration portion is formed between the piezoelectric resonant element 2 and the upper surface of the exterior case member 63. Further, an exterior substrate 62 is joined so as to close the exterior case member 63. A sealing space 67 is defined by the exterior case member 63 and the exterior substrate 62, with the piezoelectric resonant element 2 being sealed in the sealing space 67. Thus, due to the sealing space 67, a space for allowing for free and unhindered vibration is also defined above the piezoelectric resonant element 2.

External electrodes 69a through 69h are arranged so as to extend from the side surface of the laminated structure 68 defined by the exterior substrate 62 and the cavity formation exterior case 63 to the upper and lower surfaces thereof. The external electrodes 69a through 69f are arranged so as not to overlap with the space defined by the sealing space 67 in the thickness direction through the intermediary of the exterior substrate 62 and the cavity formation exterior case member 63. Thus, as in the first preferred embodiment, when the exterior substrate 62 and the cavity formation exterior case member 63 are stacked together and crimped, the pressurizing force is concentrated around the sealing space 67, so that fracture is not easily generated in the exterior substrate 62 and the portions above and below the sealing space 67.

Thus, it is possible to achieve a reduction in the thickness of the exterior substrate 62 and the thickness of the portion positioned below the sealing space 67 of the cavity formation exterior case member 63, making it possible to achieve a reduction in the thickness of the chip type piezoelectric resonant component 61.

Figure 10A:
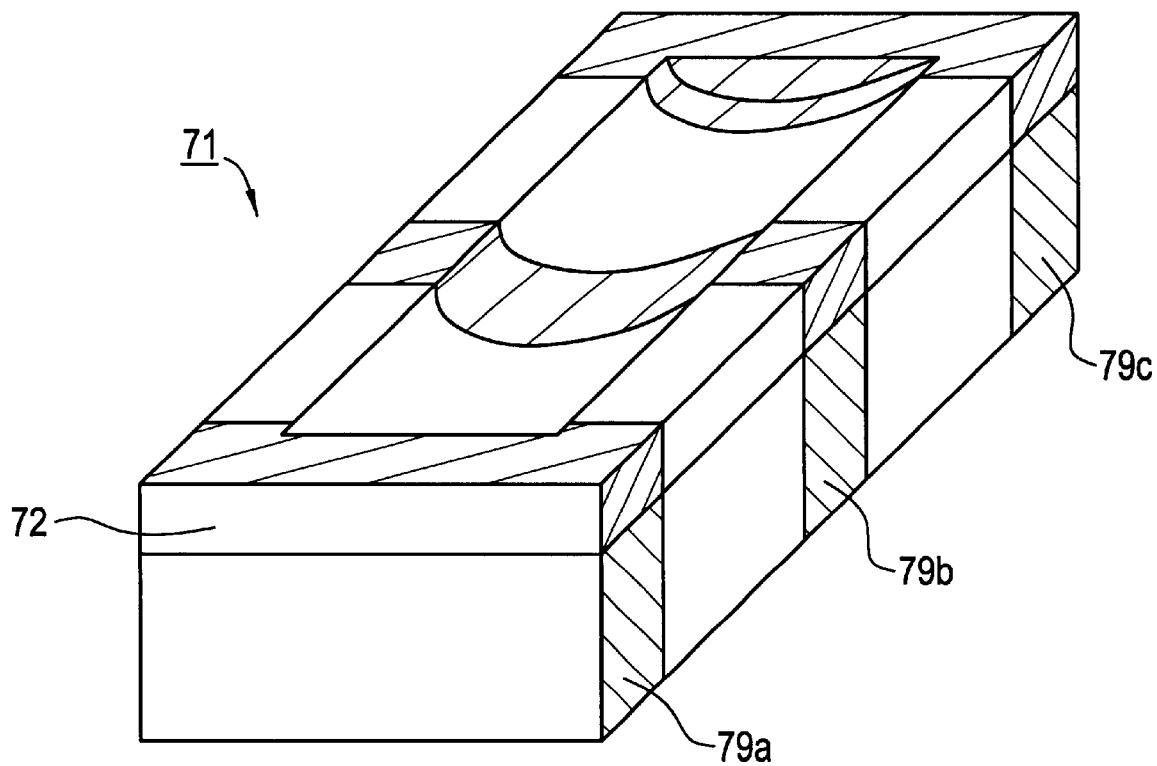
FIGS. 10A and 10B are a perspective view and a lateral sectional view for illustrating a chip type piezoelectric resonant component according to a fifth preferred embodiment of the present invention.
Figure 10B:
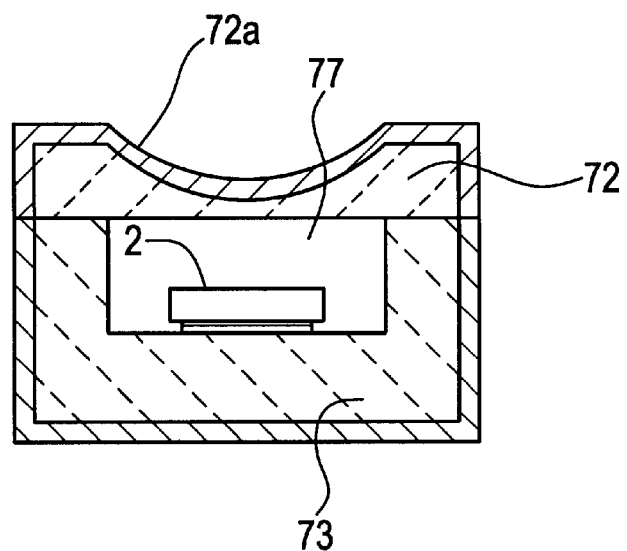

FIGS. 10A and 10B are a perspective view and a cross sectional view showing a chip type piezoelectric resonant component according to the fifth preferred embodiment of the present invention. In the chip type piezoelectric resonant component 71 of the present preferred embodiment, as in the third preferred embodiment, the exterior substrate 72 is curved toward the piezoelectric resonant element 2 in the sealing space 77 corresponding to the space. Further, the cavity formation exterior case member 73 is also curved toward the piezoelectric resonant element 2 side in the portion facing the sealing space 77. Thus, even in the case in which the external electrodes 79a through 79c are arranged so as to reach the upper surface, the pair of side surfaces and the lower surface of the laminated structure, as in the second preferred embodiment, when the exterior substrate 72 is stacked on the cavity formation exterior case member 73 and crimped onto it, the pressurizing force is not applied to the portion facing the sealing space 77 but concentrated on the sealing portion around the sealing space 77. Thus, as in the third preferred embodiment, it is possible to achieve a reduction in the thickness of the exterior substrate 72 and the cavity formation exterior case member 73.

Figure 11A:
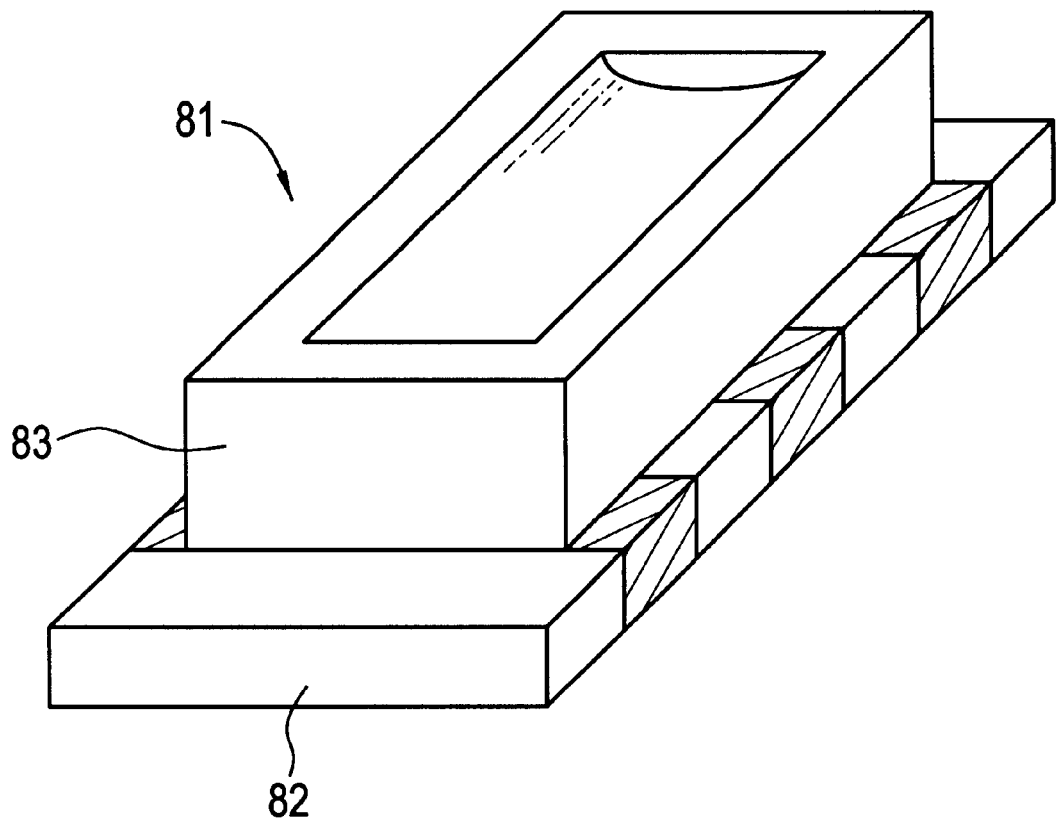
FIGS. 11A and 11B are a perspective view and a lateral sectional view showing the outward appearance of a chip type piezoelectric resonant component according to a sixth preferred embodiment of the present invention.
Figure 11B:
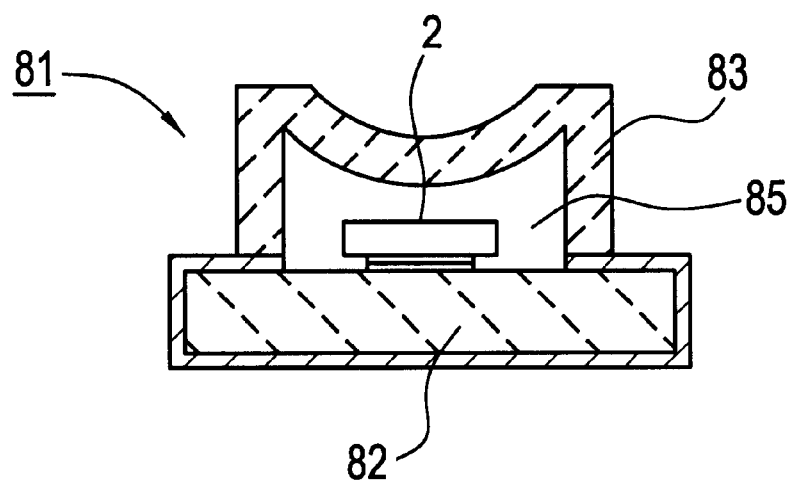

While in the fourth and fifth preferred embodiments, the configuration in plan view of the cavity formation exterior case members 63 and 73 is the same as the configuration in plan view of the exterior substrates 62 and 72, it is also possible for the size of the cavity formation exterior case member to be smaller than the size of the exterior substrate. That is, as in the case of the chip type piezoelectric resonant component 81 shown in FIG. 11, it is possible to join a cavity formation exterior case member 83 having a smaller size as compared with the exterior substrate 82. In this case, the piezoelectric resonant element 2 is fastened onto the exterior substrate 82. Also, the cavity formation exterior case member 83 is fixed to the upper surface of the exterior substrate 82 so as to surround the piezoelectric resonant element 2. That is, the cavity formation exterior case member 83 is a member corresponding to the cap of a conventionally well-known capped piezoelectric resonant component.

In this case also, as in the case of the preferred embodiment shown in FIG. 10, by curving the upper surface of the cavity formation exterior case member 83 toward the piezoelectric resonant element 2 side, it is joined to the exterior substrate 82 of the cavity formation exterior case member 83, and it is possible to reliably prevent fracture of the portion of the cavity formation exterior case member 83 facing the sealing space 85 in the crimping process. Thus, it is possible to reduce the thickness of the cavity formation exterior case member 83, making it possible to achieve a reduction in the thickness of the chip type piezoelectric resonant component 81.

In the piezoelectric resonant component of various preferred embodiments of the present invention, a plurality of external electrodes are arranged so as not to overlap with the space for allowing for free and unhindered vibration of the piezoelectric resonant element through the intermediary of the external case member, so that even when the external case member is crimped onto the piezoelectric resonant component in assembly, no large pressure is applied to the external case member in the space formation portion, so that it is possible to prevent fracture of the external case member. Similarly, also when mounting the piezoelectric resonant component on a printed circuit board or other substrate, the stress involved in the mounting operation is not applied to the exterior case member portion facing the space, so that it is possible to effectively prevent fracture of the external case member.

Thus, it is possible to reduce the thickness of the exterior case member, and to provide a thin piezoelectric resonant component, without risking defects.

In the construction in which a recess is formed in the surface on the opposite side of the surface of the exterior case member fixed to the piezoelectric resonant element so as to be opposed to the space, when assembling it by crimping the exterior case member onto the piezoelectric resonant element and when mounting the piezoelectric resonant component on the printed circuit board, pressure is not applied to the recess opposed to the space, so that it is possible to effectively prevent fracture of the exterior case member. Thus, it is possible to greatly reduce the thickness of the exterior case member and to achieve a reduction in the thickness of the piezoelectric resonant component.

In the case of the construction in which the recess that is arranged so as to be opposed to the space is formed by curving the exterior case member toward the piezoelectric resonant element side, the size in the thickness direction at the end edges of the space is large, and when, for example, the exterior case member is glued to the piezoelectric resonant element via an adhesive, it is possible to effectively prevent the oozing of the adhesive toward the piezoelectric vibration portion side, making it possible to prevent deterioration in the characteristics of the piezoelectric resonant portion and greatly improve the stability of a piezoelectric resonant component.

When a recess is formed in the surface of the exterior case member on the piezoelectric resonant element side, and a space is formed by the recess, it is possible to form a recess for allowing for free and unhindered vibration of the piezoelectric vibration portion solely by fixing the exterior case member to the piezoelectric resonant element.

Further, when the surface of the exterior case member fastened to the piezoelectric resonant element is a flat surface and the vibration-allowing space is formed by an adhesive layer, it is possible to use an inexpensive flat exterior case member, making it possible to reduce the cost of the piezoelectric resonant component.

In the construction in which the exterior case member is a flat exterior substrate and in which a pair of exterior substrates are stacked on both sides of the piezoelectric resonant element, on at least one of the exterior substrates, the plurality of external electrodes are arranged, in accordance with preferred embodiments of the present invention, so as not to overlap with the space through the intermediary of the exterior case, and the recess is formed in the surface of the exterior case fixed to the piezoelectric resonant element so as to be opposed to the space, whereby it is possible to provide an inexpensive laminated-type piezoelectric resonant component, and it is possible to effectively reduce the thickness of the piezoelectric resonant component.

In the case of the construction in which the exterior case member has a flat exterior substrate and a cavity formation exterior case member and in which the piezoelectric resonant element is fastened to the exterior substrate or the cavity formation exterior case member and sealed in the cavity formed by the exterior substrate and the cavity formation exterior case member, it is possible, in accordance with preferred embodiments of the present invention, to effectively prevent fracture of the portions of the exterior substrate and the cavity formation exterior case member facing the space in the piezoelectric resonant component having a cavity structure and a cap structure and to effectively achieve a reduction in thickness.

While the present invention has particularly shown and described with reference to the preferred embodiments thereof, it will be understood by those skilled in the art that the foregoing and other changes in form and details can be made therein without departing from the spirit and scope of the invention.

What is claimed is:

1. A piezoelectric resonant component comprising:
   an energy trap type piezoelectric resonant element including a piezoelectric plate and a plurality of resonant electrodes partially disposed on both main surfaces of the piezoelectric plate and in which a piezoelectric vibration portion is defined by a portion in which the resonant electrodes of the main surface are opposed to each other;
   an exterior case member which is fixed to at least one surface of the piezoelectric resonant element so as to define a space arranged to allow for free and unhindered vibration of the vibration portion of the piezoelectric resonant element; and
   a plurality of external electrodes disposed on the surface on the opposite side of the surface of the exterior case member which is fixed to the piezoelectric resonant element;
   wherein the plurality of external electrodes are arranged such that the plurality of external electrodesdo not overlap with the space through the intermediary of the exterior case member; and
   wherein the portion of the exterior case member which is opposed to the space is curved toward the piezoelectric resonant element side.

2. A piezoelectric resonant component comprising:
   an energy trap type piezoelectric resonant element including a piezoelectric plate and a plurality of resonant electrodes partially disposed on both main surfaces of the piezoelectric plate and in which a piezoelectric vibration portion is defined by a portion in which the resonant electrodes of the main surfaces are opposed to each other;
   an exterior case member which is fixed to at least one surface of the piezoelectric resonant element so as to define a space arranged to allow for free and unhindered vibration of the vibration portion of the piezoelectric resonant element; and
   a plurality of external electrodes disposed on the surface on the opposite side of the surface of the exterior case member which is fixed to the piezoelectric resonant element;
   wherein the plurality of external electrodes are arranged such that the plurality of external electrodes do not overlap with the space through the intermediary of the exterior case member; and
   wherein the external electrodes are arranged to define capacitors.

3. A piezoelectric resonant component according to claim 2, wherein a recess is formed in the piezoelectric resonant element side surface of the exterior case member, and wherein the space is defined by the recess.

4. A piezoelectric resonant component according to claim 3, wherein the recess is substantially rectangular.

5. A piezoelectric resonant component according to claim 2, wherein the surface of the exterior case member which is fixed to the piezoelectric resonant element is a flat surface, and wherein the adhesive layer joining the piezoelectric resonant element with the exterior case member is constructed so as to define the space.

6. A piezoelectric resonant component according to claim 2, wherein the exterior case member is a flat-plate exterior substrate, and the pair of exterior substrates are stacked on both sides of the piezoelectric resonant element.

7. A piezoelectric resonant component comprising:
   an energy trap type piezoelectric resonant element including a piezoelectric plate and a plurality of resonant electrodes partially disposed on both main surfaces of the piezoelectric plate and which a piezoelectric vibration portion is defined by a portion in which the resonant electrodes of the main surfaces are opposed to each other;
   an exterior case member which is fixed to at least one surface of the piezoelectric resonant element so as to define a space arranged to allow for free and unhindered vibration of the vibration portion of the piezoelectric resonant element; and
   a plurality of external electrodes disposed on the surface on the opposite side of the surface of the exterior case member which is fixed to the piezoelectric resonant element;
   wherein the plurality of external electrodes are arranged such that the plurality of external electrodes do not overlap with the space through the intermediary of the exterior case member; and
   wherein the exterior case member has a flat-plate exterior substrate and a cavity forming exterior case member having a opening on the exterior substrate side and joined to the exterior substrate from the opening side, and wherein the piezoelectric resonant element is fastened to the exterior substrate or the cavity forming exterior case member and sealed in a cavity defined by the exterior substrate and the cavity forming exterior case member.

8. A piezoelectric resonant component comprising:
   an energy trap type piezoelectric resonant element including a piezoelectric plate and a plurality of resonant electrodes partially disposed on both main surfaces of the piezoelectric plate and in which a piezoelectric vibration portion is defined by a portion in which the resonant electrodes of the main surfaces are opposed to each other;
   an exterior case member which is fixed to a t least one surface of the piezoelectric resonant element so as to define a space arranged to allow for free and unhindered vibration of the vibration portion of the piezoelectric resonant element; and
   a plurality of external electrodes disposed on the surface on the opposite side of the surface of the exterior case meber which is fixed to the piezoelectric resonant element;
   wherein the plurality of external electrodes are arranged such that the plurality of external electrodes do not overlap with the space through the intermediary of the exterior case member; and
   wherein the exterior case portion includes a curved portion located at the space and a flat portion defining a sealing portion.

9. A piezoelectric resonant component comprising:

an energy trap type piezoelectric resonant element including a piezoelectric plate and a plurality of resonant electrodes partially disposed on both main surfaces of the piezoelectric plate and in which a piezoelectric vibration portion is defined by a portion in which the resonant electrodes of the main surfaces are opposed to each other;

an exterior case member which is fixed to at least one surface of the piezoelectric resonant element so as to define a space arranged to allow for free and unhindered vibration of the vibration portion of the piezoelectric resonant element; and plurality of external electrodes disposed on the surface on the opposite side of the surface of the exterior case member which is fixed to the piezoelectric resonant element;

wherein the plurality of external electrodes are arranged such that the plurality of external electrodes do not overlap with the space through the intermediary of the exterior case member; and wherein the exterior case portion includes a curved portion on each of the inner and outer surfaces thereof.

10. A piezoelectric resonant component comprising:

an energy trap type piezoelectric resonant element including a piezoelectric plate and a plurality of resonant electrodes partially disposed on both main surfaces of the piezoelectric plate and in which a piezoelectric vibration portion is defined by a portion in which the resonant electrodes of the main surfaces are opposed to each other;

an exterior case member which is fixed to at least one surface of the piezoelectric resonant element so as define a space arranged to allow for free and unhindered vibration of the vibration portion of the piezoelectric resonant element;

a plurality of external electrodes disposed on the surface on the opposite side of the surface of the exterior case member which is fixed to the piezoelectric resonant element; and a substantially rectangular frame-like spacer sheet and exterior substrate sheets disposed above the piezoelectric resonant element so as to define the space;

wherein the plurality of external electrodes are arranged such that the plurality of external electrodes do not overlap with the space through the intermediary of the exterior case member.

11. A piezoelectric resonant component comprising:

an energy trap type piezoelectric resonant element including a piezoelectric plate and a plurality of resonant electrodes partially disposed on both main surfaces of the piezoelectric plate and in which a piezoelectric vibration portion is defined by a portion in which the resonant electrodes of the main surfaces are opposed to each other;

an exterior case member which is fixed to at least one surface of the piezoelectric resonant element so as to define a space for allowing for free and unhindered vibration of the vibration portion of the piezoelectric resonant element; and a plurality of external electrodes disposed on the surface on the opposite side of the surface of the exterior case member which is fixed to the piezoelectric resonant element;

wherein a recess is formed in the surface on the opposite side of the surface of the exterior case member which is fixed to the piezoelectric resonant element so as to be opposed to the space.

12. A piezoelectric resonant component according to claim 11, wherein the portion of the exterior case member which is opposed to the space is curved toward the piezoelectric resonant element side.

13. A piezoelectric resonant component according to claim 11, wherein a recess is formed in the piezoelectric resonant element side surface of the exterior case member, and wherein the space is defined by the recess.

14. A piezoelectric resonant component according to claim 13, wherein the recess is substantially rectangular.

15. A piezoelectric resonant component according to claim 11, wherein the surface of the exterior case member which is fixed to the piezoelectric resonant element is a flat surface, and wherein the adhesive layer joining the piezoelectric resonant element with the exterior case member is constructed so as to define the space.

16. A piezoelectric resonant component according to claim 11, wherein the exterior case member is a flat-plate exterior substrate, and the pair of exterior substrates are stacked on both sides of the piezoelectric resonant element.

17. A piezoelectric resonant component according to claim 11, wherein the exterior case member has a flat-plate exterior substrate and a cavity forming exterior case member having an opening on the exterior substrate side and joined to the exterior substrate from the opening side, and wherein the piezoelectric resonant element is fastened to the exterior substrate or the cavity forming exterior case member and sealed in a cavity defined by the exterior substrate and the cavity forming exterior case member.

18. A piezoelectric resonant component according to claim 11, wherein the external electrodes are arranged to define capacitors.

19. A piezoelectric resonant component according to claim 11, wherein the exterior case portion includes a curved portion located at the space and a flat portion defining a sealing portion.

20. A piezoelectric resonant component according to claim 11, wherein the exterior case portion includes a curved portion on each of the inner and outer surfaces thereof.

* * * * *